United States Patent
Jung

(10) Patent No.: US 7,088,082 B2
(45) Date of Patent: Aug. 8, 2006

(54) REGULATOR WITH VARIABLE CAPACITOR FOR STABILITY COMPENSATION

(75) Inventor: Soon-Gil Jung, Santa Clara, CA (US)

(73) Assignee: Quick Logic Corporation, Sunnyvale, CA (US)

(*) Notice: Subject to any disclaimer, the term of this patent is extended or adjusted under 35 U.S.C. 154(b) by 16 days.

(21) Appl. No.: 10/738,382

(22) Filed: Dec. 16, 2003

(65) Prior Publication Data

US 2005/0127885 A1   Jun. 16, 2005

(51) Int. Cl.
*G05F 1/618* (2006.01)
(52) U.S. Cl. .................. 323/275; 323/274; 323/273
(58) Field of Classification Search ................ 323/275, 323/273, 274
See application file for complete search history.

(56) References Cited

U.S. PATENT DOCUMENTS

| | | | | |
|---|---|---|---|---|
| 4,276,513 A | * | 6/1981 | Johnston et al. | 330/9 |
| 4,453,143 A | * | 6/1984 | Bennett | 333/28 R |
| 4,481,466 A | * | 11/1984 | Roos et al. | 324/71.1 |
| 4,494,082 A | * | 1/1985 | Bennett | 333/28 R |
| 5,640,082 A | * | 6/1997 | Lusher et al. | 323/293 |
| 5,686,821 A | * | 11/1997 | Brokaw | 323/273 |
| 6,011,433 A | * | 1/2000 | Nairn | 330/2 |
| 6,118,332 A | * | 9/2000 | Jabs | 327/553 |
| 6,492,876 B1 | * | 12/2002 | Kamal et al. | 330/304 |
| 6,566,846 B1 | * | 5/2003 | Voo | 323/267 |
| 6,587,006 B1 | * | 7/2003 | Kawajiri et al. | 331/45 |
| 6,771,124 B1 | * | 8/2004 | Ezell | 330/129 |
| 6,781,257 B1 | * | 8/2004 | Willis | 307/77 |

OTHER PUBLICATIONS

Gabriel A. Rincon-Mora et al., "A Low Voltage, Low Quiescent Current, Low Drop-Out Regulator", IEEE Journal of Solid State Circuits, vol. 33, No. 1, Jan. 1998, pp. 36-44.
Ka Nang Leung et al., "A Capacitor-Free CMOS Low-Dropout Regulator With Damping-Factor-Control Frequency Compensation", Journal of Solid State Circuits, vol. 38, No. 10, Oct. 2003, pp. 1691-1702.

* cited by examiner

*Primary Examiner*—Bao Q. Vu
(74) *Attorney, Agent, or Firm*—Silicon Valley Patent Group LLP

(57) ABSTRACT

A voltage regulator with a variable compensation capacitor is capable of driving a large variable dynamic current load. The regulator includes an error amplifier and an output stage amplifier. The variable compensation capacitor is disposed between the output terminal of the error amplifier and the output terminal of the output stage amplifier. In one embodiment, a NMOS transistor is disposed between the output terminal of the output stage amplifier and the variable compensation capacitor. The variable compensation capacitor may be, e.g., a PMOS transistor with the source and drain tied together. In one embodiment, a plurality of regulators is included on chip, e.g., such as a programmable device, where the output terminals of each regulator is tied together and used to drive the same load.

14 Claims, 3 Drawing Sheets

REGULATOR WITH VARIABLE CAPACITOR FOR STABILITY COMPENSATION

FIELD OF THE INVENTION

The present invention relates to voltage regulators and in particular to voltage regulators for variable current loads.

BACKGROUND

There is an increasing need for low-voltage, low drop out regulators due to the growing demand in portable electronics, which require low power and low cost system-on-chip designs.

FIG. 1 illustrates a conventional low drop PMOS output regulator 10 that is composed of two gain stages with a negative feedback. The first stage is an error amplifier 12 with a transconductance of $gm_1$. Feedback is provided to the amplifier 12 from a voltage divider with resistors 14 and 16. The amplifier 12 receives the input voltage and a reference voltage Vref on the negative input terminal and the feedback on the positive input terminal. The output stage is a PMOS transistor 18, which has a transconductance of $gm_2$. The output stage of regulator 10 has a common source configuration. The gate of the transistor 18 is coupled to the Vout through a compensation capacitor 20. The load of regulator 10 is illustrated as current source $I_L$, and resistor $R_L$, while capacitor $C_L$ is a load capacitor.

In order to obtain enough phase margin for stability of the closed loop transfer function with a constant load, the design should obey the following:

$$\frac{1}{3} = \frac{gm_1 * C_L}{gm_2 * C_C} \qquad \text{eq. 1}$$

where $C_L$ is the total load capacitance, and $C_C$ is the compensation capacitance from capacitor 20. In order to obtain more phase margin, a series resistor, $R > 1/gm_2$, can be inserted between capacitor 20 and the Vout. Such a series resistor results in more closed loop phase margin for better stability.

The design of a regulator 10 that meets equation 1 is not difficult where there is a constant and static current load. Unfortunately, where a variable and dynamic current load is present, regulator 10 is inadequate. Thus, for an on-chip load that generates a very large dynamic spike current, such as that might be found in field programmable gate arrays (FPGAs), the variable dynamic load current will generate a large amount of output voltage noise through the output impedance of the regulator. For example, where the current load is 1.5 A p-p, and the DC impedance of the regulator output is 1 ohm, the resulting noise will be 1.5V p-p, e.g., Vout(noise)=1.5 A p-p*1 ohm=1.5V p-p. If the regulator output is driving a large variable dynamic spike current load, the loop stability through a frequency compensation because particularly difficult to manage.

Accordingly, an improved regulator is needed, particularly for applications that may have dynamic and variable currents, such as in field programmable gate arrays (FPGAs) where the current load depends on the end user's program.

SUMMARY

In accordance with an embodiment of the present invention, a regulator includes a variable compensation capacitor, which enables the regulator to drive a large variable dynamic current load. Accordingly, the regulator is particularly useful in programmable devices, such as FPGAs in which the current load varies based upon the end user's desired circuit. A plurality of regulators may be used to drive the same load within a programmable device.

In one embodiment, an apparatus includes a regulator having a first amplifier with a first input terminal coupled to a reference terminal of the regulator to receive a reference voltage. The regulator also includes a second amplifier that has a first terminal coupled to the output terminal of the first amplifier. The second amplifier has a second terminal that receives the input voltage and a third terminal that is coupled to the regulator's output terminal. The second amplifier's third terminal is also coupled to a second input terminal of the first amplifier. The regulator further includes a variable capacitor that is disposed between the output terminal of the first amplifier and the second terminal of the second amplifier. In one embodiment, the variable capacitor may be a transistor with its gate coupled to the output terminal of the first amplifier and the drain and source both coupled to the first terminal of the second amplifier. There may be a transistor disposed between the third terminal of the second amplifier and the variable capacitor. In another embodiment, a plurality of regulators has output terminals coupled together and are all included on a single integrated circuit.

In another aspect of the present invention, a method of regulating a voltage includes providing an input voltage and providing a reference voltage. A first stage output voltage is generated based on the reference voltage and a feedback voltage. To produce a regulated output voltage, the amplification of an input voltage is controlled based on the first stage output voltage. Instabilities in the input voltage are compensated for using a variable capacitance between the first stage output voltage and a second voltage that is based on the regulated output voltage. The second voltages may be the regulated output voltage minus a gate source voltage of a transistor. The feedback voltage may be produced by dividing the regulated output voltage. In one embodiment, a plurality of regulated output voltages a produced and combined. The combined regulated output voltages are then provided to a load.

Another aspect of the present invention is an integrated circuit that includes a plurality of regulators for receiving in input voltage and providing a plurality of regulated output voltages. The integrated circuit includes a programmable portion of the integrated circuit, wherein each of the plurality of regulators is approximately equidistance from the programmable portion within the integrated circuit.

DETAILED DESCRIPTION

Figure 1:
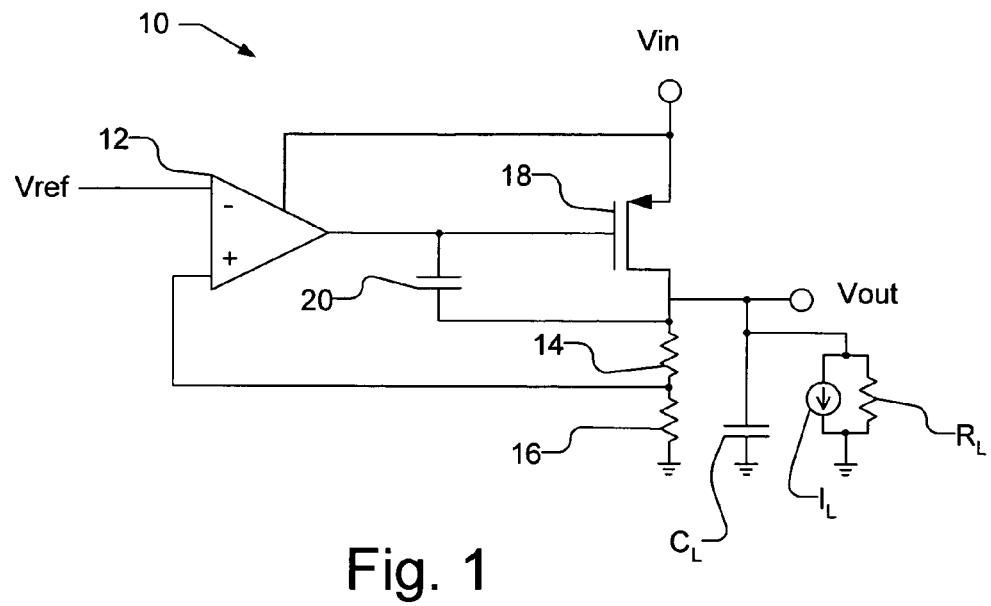
FIG. 1 illustrates a conventional low drop PMOS output regulator that is composed of two gain stages with a negative feedback.
Figure 2:
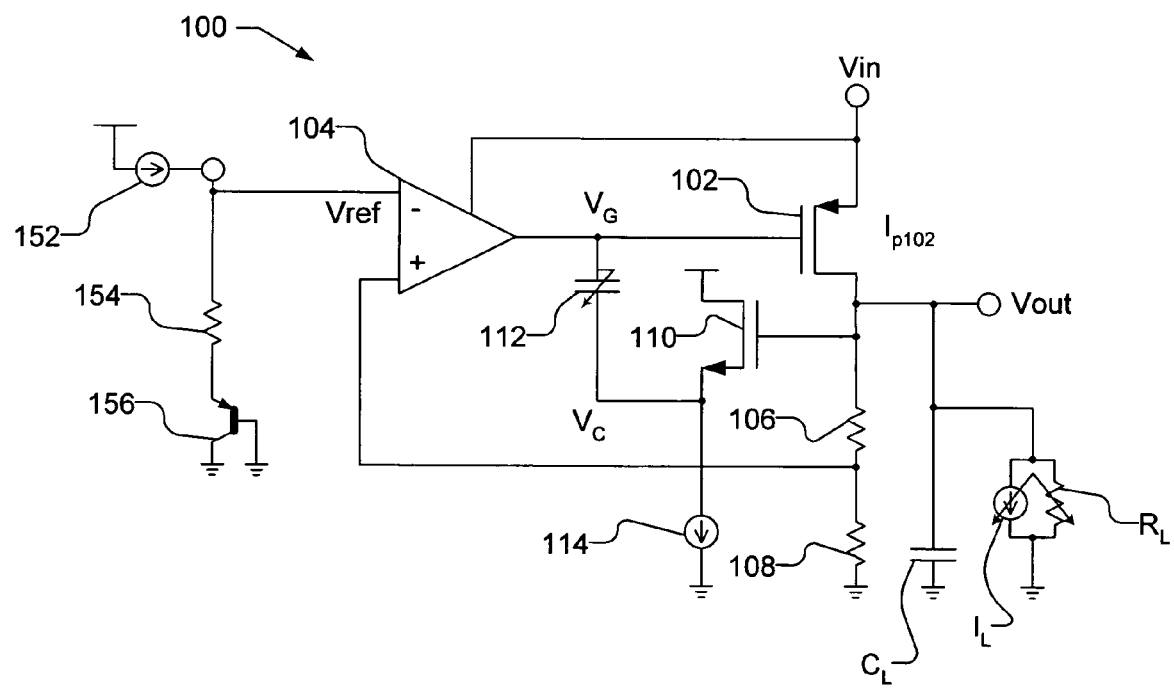
FIG. 2 illustrates a regulator in accordance with an embodiment of the present invention.

FIG. 2 illustrates a regulator 100 in accordance with an embodiment of the present invention. Regulator 100 may be, e.g., an FPGA core cell power supply that is built on the chip and is capable of handling a large variable dynamic current, e.g., up to 1.5 A p-p, from the user's programmed portion of the FPGA. As can be seen in FIG. 2, the output load is modeled with a variable current $I_L$ and resistance $R_L$. The output stage of regulator 100 is a PMOS transistor 102 in a common source configuration.

The regulator 100 includes a negative feedback system that provides a regulator output voltage with low output impedance, high input impedance, high open loop gain and a sufficient loop stability that the voltage output can be represented by the following equation with little or no error factors.

$$Vout = Vref\left(1 + \frac{R_{106}}{R_{108}}\right) \qquad \text{eq. 2}$$

As illustrated in FIG. 2, the regulator 100 includes an error amplifier 104 that receives feedback at the positive input terminal from the voltage divider composed of resistors 106 and 108. The transconductance of amplifier 104 will be referred to herein as $gm_1$, while the transconductance of transistor 102 will be referred to herein as gm2. The amplifier 104 receives an input voltage from Vin and a reference voltage Vref on the negative input terminal. An NMOS transistor 110 has its gate coupled to the output voltage Vout and its source coupled to the output terminal of the amplifier 104 and the gate of the PMOS transistor 102 via a variable compensation capacitor 112. The source of the transistor 110 is also coupled to ground through a current source 114. The drain of transistor 110 is coupled to Vin.

Advantageously, the use of the variable capacitor 112 permits a constant ratio in the denominator of equation 1, e.g., $3=gm_2*C_C$, where the value $C_c$ represents the capacitance of the variable compensation capacitor 112 in FIG. 2. A constant ratio in the denominator (and in the numerator) of equation 1, advantageously provides good loop stability.

The total output drive current of regulator 100 is represented as follows:

$$I_{102} = Iq + I_L \qquad \text{eq. 3}$$

where $Iq=Vout/(R_{106}+R_{108})$ and $I_L$ is the variable load current, e.g., as provided by the programmed FPGA. The voltages at nodes $V_G$ and $V_C$ in FIG. 2 can be represented as:

$$V_G = Vin - V_{GS102} \qquad \text{eq. 4}$$

$$V_C = Vout - V_{GS110} \qquad \text{eq. 5}$$

where $V_{GS102}$ and $V_{GS110}$ is the gate source voltages of transistors 102 and 110, respectively. If the output drive current $I_{102}$ is approximately equal to the variable load current $I_L$, the voltage $V_{GS102}$ can be represented as follows:

$$V_{GS102} = \sqrt{\frac{2I_L}{K_{102}}} + Vth_{102} \qquad \text{eq. 6}$$

where $Iq \ll I_L$ and $K_{102} = \mu_{102}*Cox*(W/L)_{102}$, is the transconductance parameter of transistor 102, $\mu_{102}$ is the surface mobility of the channel for transistor 102, Cox is the capacitance per unit area of the gate oxide and $(W/L)_{102}$ is the width and length of the channel for transistor 102, and the term $Vth_{102}$ is the threshold voltage for transistor 102.

The transconductance $gm_2$ for transistor 102 may be written as follows:

$$gm_2 = \sqrt{2*K_{102}*I_L}. \qquad \text{eq. 7}$$

Further, the capacitance $C_C$ of the variable compensation capacitor 112 can be written as:

$$\begin{aligned} C_C &= Cox\left(\frac{W}{L}\right)*(V_G - V_C) \\ &= Cox\left(\frac{W}{L}\right)*(Vin - V_{GS102} - V_C) \\ &= Cox\left(\frac{W}{L}\right)*\left(Vin - \sqrt{\frac{2I_L}{K_{102}}} + Vth_{102} - V_C\right). \end{aligned} \qquad \text{eq. 8}$$

Figure 3:
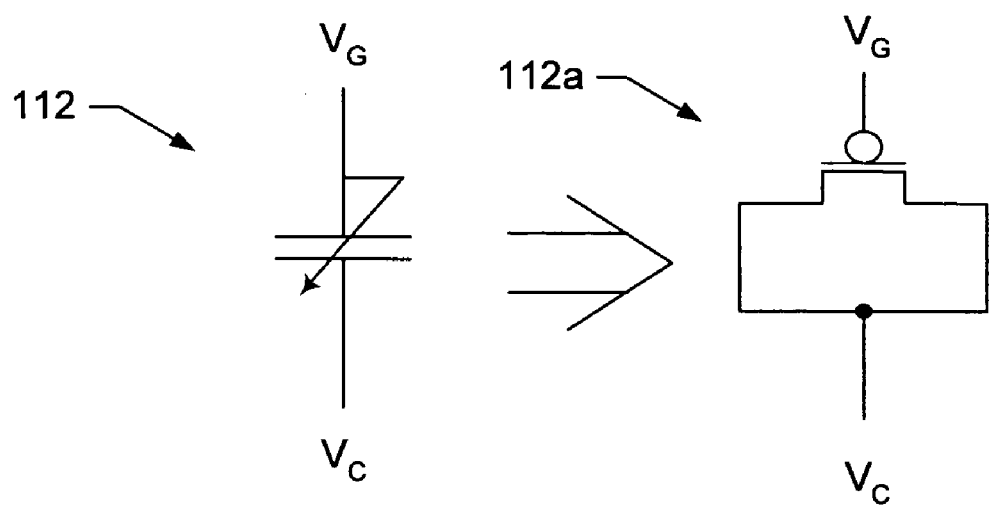
FIG. 3 illustrates the variable capacitor used in one embodiment of the present invention.
Figure 4:
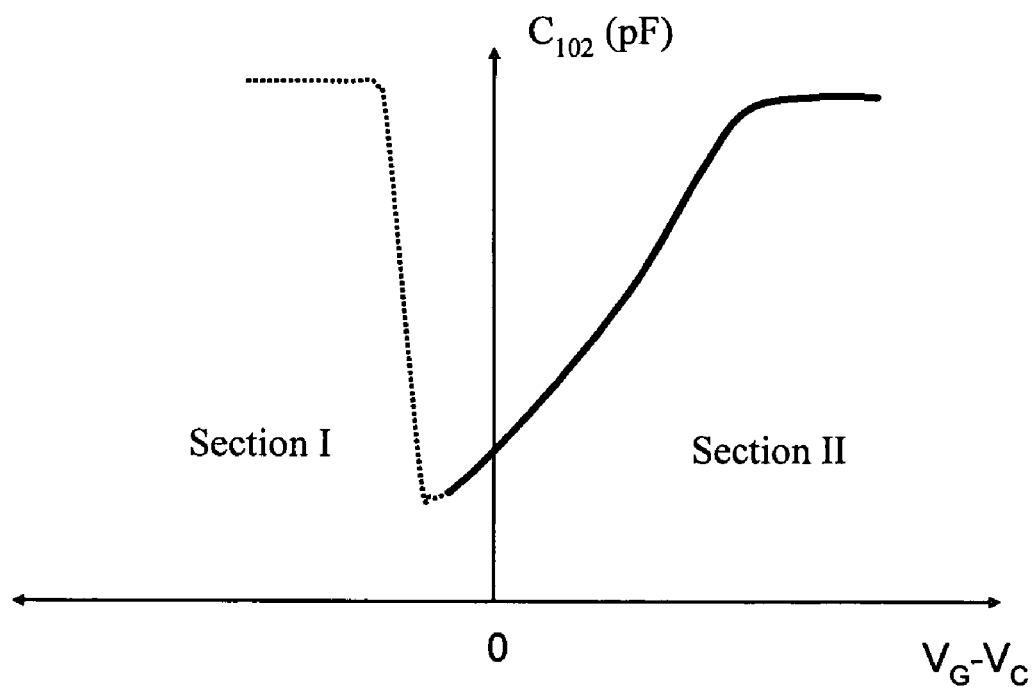
FIG. 4 illustrates the capacitance of variable capacitor where the X-axis represents the voltage ($V_G$–$V_C$) and the Y-axis represents the capacitance in pF.

FIG. 3 illustrates one embodiment of the variable capacitor 112 as a PMOS transistor 112a with the source coupled to the drain. FIG. 4 illustrates the capacitance of variable capacitor 112 where the X-axis represents the voltage ($V_G$-$V_C$) and the Y-axis represents the capacitance in pF.

With the use of the variable capacitor 112, the denominator term in equation 1, $3=gm_2*C_C$, is maintained over a variation in the load current $I_L$, since the transconductance $gm_2$ and the capacitance $C_C$ have inverse characteristics as shown in equations 7 and 8 above, i.e., where $gm_2$ is related to $+\sqrt{I_L}$ and $C_C$ is related to $-\sqrt{I_L}$. Accordingly, the phase margin of the regulator 100 will not worsen over variation in the load current $I_L$.

Figure 5:
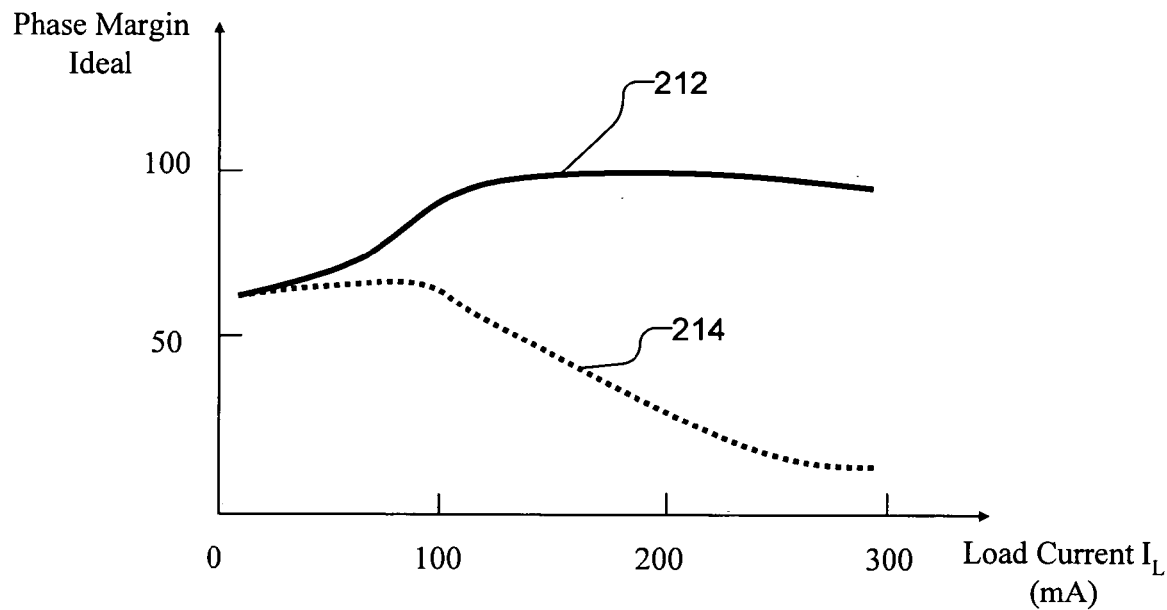
FIG. 5 illustrates a simulation result of the phase margin versus the load current of the regulator.

FIG. 5 illustrates a simulation result of the phase margin versus the load current. The broken line 214 represents the phase margin for a conventional regulator 10 with a constant compensation capacitor 20, while the solid line 212 represents the phase margin for regulator 100 with variable capacitor 112 based on the reverse bias Section-II MOS capacitor characteristic curve from FIG. 4. As can be seen, the variable capacitor 112 provides an approximately constant phase margin 212 for load current variations up to 300 mA, while the phase margin 214 for the constant capacitor 20 significantly decreases over the same range.

The reference voltage Vref should be a band-gap reference voltage. The reference voltage Vref is provided by a constant current source 152 and a resistor 154 in series with a pnp bipolar transistor 156 with its base tied to ground. The current driving configuration shown in FIG. 2 can be used to drive multiple junctions over a long distance, wide die area with a single constant current generator.

Figure 6:
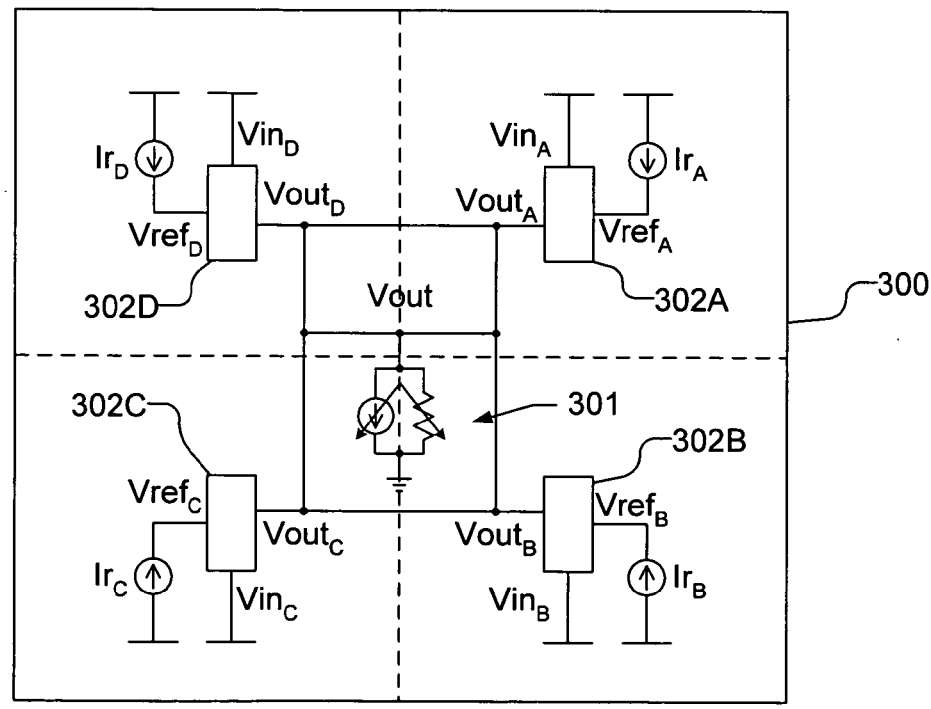
FIG. 6 schematically illustrates an on-chip regulator topology in accordance with another embodiment of the present invention.

FIG. 6 schematically illustrates an on-chip regulator topology in accordance with another embodiment of the present invention. The topology of FIG. 6 advantageously provides on-chip regulator biasing over a large area, e.g., 8 mm×8 mm. FIG. 6 shows a chip 300, such as an FPGA or other semiconductor device, with a variable load 301 and a plurality of separate regulators 302A, 302B, 302C, and 302D, collectively referred to herein sometimes as regulators 302. The variable load 301 may be, e.g., a programmable portion of an integrated circuit. The regulators 302 are located in different sections of the chip 300, indicated by the broken lines. By way of example, four regulators 302 are shown in FIG. 6, with each regulator placed in a different quadrant. If desired, however, additional regulators may be located symmetrically within chip 300, i.e., approximately equidistant from the programmable portion, i.e., the load 301, of the chip. Thus, the current driving density of the device is reduced, which reduces thermal degradation of contact and metal layers thereby securing long-term reliability of the device.

In one embodiment, the input voltage $Vin_A$, $Vin_B$, $Vin_C$, and $Vin_D$ to the plurality of regulators 302A, 302B, 302C, and 302D, respectively, are the same input voltages and can be supplied from different pads on the chip 300 or from the same pad. The reference voltages $Vref_A$, $Vref_B$, $Vref_C$, and $Vref_D$ for the plurality of regulators 302A, 302B, 302C, and 302D, respectively, are the same band-gap reference voltages with the same constant current bias, $Ir_A$, $Ir_B$, $Ir_C$, and $Ir_D$, which is generated by the a common bias circuit block, e.g., illustrated in FIG. 2.

Each of the regulators 302 is the same as regulator 100 shown in FIG. 2. The use of four regulators 302, advantageously, reduces the output-driving requirement of the any single regulator by one quarter. Thus, the size of the output transistor 102 and the load capacitor $C_L$, shown in FIG. 2, may be reduced by one quarter. By way of example, with four regulators 302 used, the output transistor 102 (from FIG. 2) may have a size W/L of 8000/0.3 and the $C_L$ may be 1225 pF. If only one regulator were used, the transistor size would be W/L 32000/0.3, and the $C_L$ would be 4900 pF. By coupling all the regulators 302 to the variable load 301, as well as placing the regulators 302 approximately equidistant to the variable load 301, the parasitic components of the layout connection is reduced.

The output voltages $Vout_A$, $Vout_B$, $Vout_C$, and $Vout_D$ from the plurality of regulators 302A, 302B, 302C, and 302D, respectively, are combined and provided as a single output voltage Vout to the variable load 301. The output voltage Vout is the average of the output voltages from each of the regulators 302, i.e., $$Vout = \frac{1}{4}(Vout_A + Vout_B + Vout_C + Vout_D). \qquad \text{eq. 9}$$

Similarly, the output voltage noise will also be the average of the voltage noise from each regulator.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
    a regulator having an input terminal, a reference terminal and an output terminal, the regulator comprising:
    a first amplifier having a first input terminal, a second input terminal and an output terminal, the first input terminal coupled to the reference terminal of the regulator to receive a reference voltage;
    a second amplifier having a first terminal, a second terminal and a third terminal, the first terminal coupled to the output terminal of the first amplifier, the second terminal coupled to the input terminal of the regulator to receive an input voltage, the third terminal coupled to the output terminal of the regulator and coupled to the second input terminal of the first amplifier; and
    a variable capacitor disposed between the output terminal of the first amplifier and the first terminal of the second amplifier.

2. The apparatus of claim 1, wherein the variable capacitor comprises a transistor having a first terminal, a second terminal and a third terminal, the first terminal coupled to the output terminal of the first amplifier, and the second terminal and third terminal coupled to the first terminal of the second amplifier.

3. The apparatus of claim 1, further comprising:
    a transistor disposed between the variable capacitor and the third terminal of the second amplifier, the transistor having a first terminal, a second terminal and a third terminal, the first terminal coupled to the third terminal of the second amplifier, the second terminal coupled to the input terminal of the regulator to receive the input voltage, and the third terminal coupled to variable capacitor; and
    a current source coupled to the third terminal of the transistor.

4. The apparatus of claim 1, wherein the first amplifier is an error amplifier.

5. The apparatus of claim 1, wherein the second amplifier is a p channel MOSFET transistor.

6. The apparatus of claim 1, further comprising a voltage divider coupled to the third terminal of the second amplifier and coupled to the second input terminal of the first amplifier.

7. The apparatus of claim 1, wherein the regulator is a first regulator, the apparatus further comprising a plurality of regulators, each regulator having an input terminal, a reference terminal and an output terminal, wherein the output terminals of the plurality of regulators are coupled together, each of the plurality of regulators comprising:
    a first amplifier having a first input terminal, a second input terminal and an output terminal, the first input terminal coupled to the reference terminal of the regulator to receive a reference voltage;
    a second amplifier having a first terminal, a second terminal and a third terminal, the first terminal coupled to the output terminal of the first amplifier, the second terminal coupled to the input terminal of the regulator to receive an input voltage, the third terminal coupled to the output terminal of the regulator and coupled to the second input terminal of the first amplifier; and
    a variable capacitor disposed between the output terminal of the first amplifier and the first terminal of the second amplifier.

8. The apparatus of claim 7, wherein the apparatus is an integrated circuit, wherein the output terminals of the plurality of regulators are approximately equidistant from a load on the integrated circuit.

9. The apparatus of claim 8, wherein the integrated circuit is a programmable circuit and wherein the load has a load resistance and a load current that is dependent on the programming of the programmable circuit.

10. The apparatus of claim 9, wherein the integrated circuit is a field programmable gate array.

11. A method of regulating a voltage, the method comprising:
    providing an input voltage;
    providing a reference voltage;
    generating a first stage output voltage based on the reference voltage and a feedback voltage;

controlling the amplification of input voltage based on the first stage output voltage to produce a regulated output voltage; and compensating for instabilities in the input voltage using a variable capacitance between the first stage output voltage and a second voltage based on the regulated output voltage.

12. The method of claim 11, wherein the second voltage is the regulated output voltage minus a gate source voltage of a transistor.

13. The method of claim 11, further comprising dividing the regulated output voltage to produce the feedback voltage.

14. The method of claim 11, further comprising:
producing a plurality of regulated output voltages;
combining the plurality of regulated output voltages;
providing the combined plurality of regulated output voltages to a load.

* * * * *